United States Patent [19]
Diana et al.

[11] Patent Number: 5,932,924
[45] Date of Patent: Aug. 3, 1999

[54] LEADFRAME HAVING CONTINUOUSLY REDUCING WIDTH AND SEMICONDUCTOR DEVICE INCLUDING SUCH A LEADFRAME

[75] Inventors: Joseph B. Diana; Victor Manuel Torres, both of Austin, Tex.

[73] Assignee: Motorola, Inc., Schaumburg, Ill.

[21] Appl. No.: 09/016,988

[22] Filed: Feb. 2, 1998

[51] Int. Cl.⁶ .............................................. H01L 23/495
[52] U.S. Cl. .......................................................... 257/676
[58] Field of Search ................................... 257/666, 669, 257/676

[56] References Cited

U.S. PATENT DOCUMENTS 4,797,726  1/1989  Manabe ................................... 257/669
5,233,222  8/1993  Djennas et al. .......................... 257/676

*Primary Examiner*—Olik Chaudhuri
*Assistant Examiner*—Nathan K. Kelley

[57] ABSTRACT

A leadframe (100) has a flag having an outer contour that tapers from first and second opposing ends (160, 162) to a common point, the midline (200) of the flag. The tapering of the leadframe is continuous, extending from points adjacent the first and second ends or from the ends themselves, to the common midline. According to this structure, a wide range of die sizes may be accommodated with a single leadframe, while simultaneously preventing popcorning of the packaged semiconductor device (300) incorporating the leadframe.

17 Claims, 4 Drawing Sheets

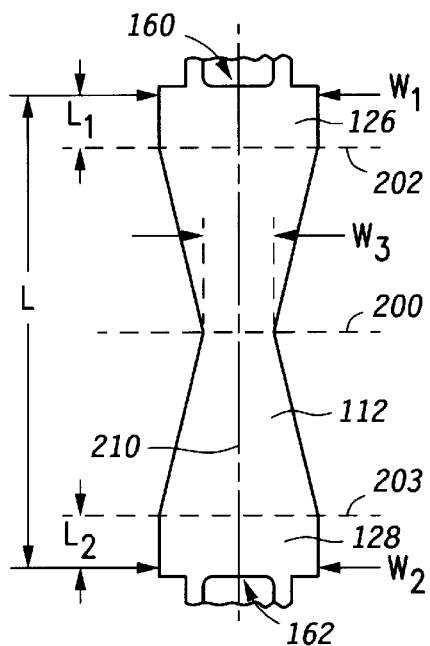
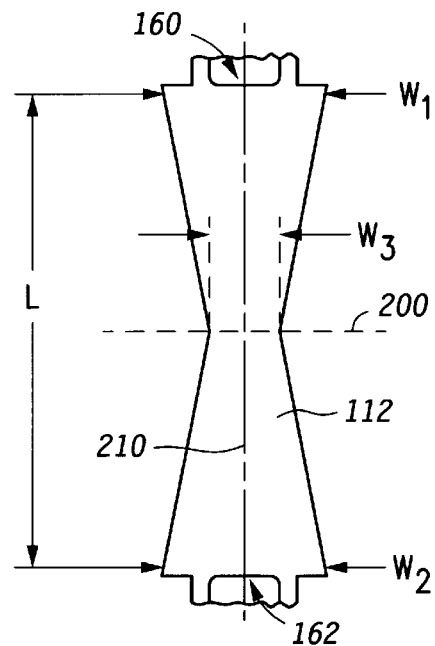
*FIG.5*   *FIG.6*
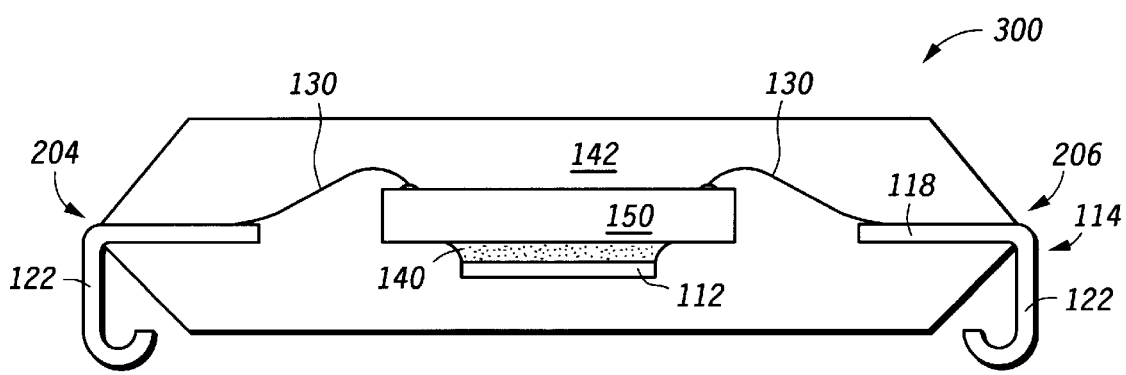
*FIG.7*

LEADFRAME HAVING CONTINUOUSLY REDUCING WIDTH AND SEMICONDUCTOR DEVICE INCLUDING SUCH A LEADFRAME

FIELD OF THE INVENTION

The present invention is drawn to a leadframe and a semiconductor device incorporating such a leadframe.

BACKGROUND OF THE INVENTION

Various types of leadframe designs are currently used in the semiconductor industry for packaging semiconductor die. One such known leadframe is shown in FIG. 1. As illustrated, FIG. 1 depicts a leadframe 10 having a flag 12 and a plurality of leads 14 having inner lead portions that terminate at lead tips 16, the lead tips 16 defining a die receiving area. The flag 12 receives and supports a semiconductor die 50. Each lead 14 includes an exposed lead portion 22 (which is exposed from the packaged semiconductor device), and a bond finger 18 (which is encapsulated by the plastic encapsulant material). Each bond finger 18 includes a lead tip 16 to which bond wires from the semiconductor die 50 are routed. The flag is supported, prior to singulation and encapsulation, by two sets of tie bars 20, extending parallel to the longitudinal axis of the leadframe, and perpendicular to the short axis of the leadframe.

The leadframe depicted in FIG. 1 is considered an improvement upon a conventional leadframe that has a solid flag. The flag 12 shown in FIG. 1 is generally known in the art as a "window flag," named as such for the opening in the central portion of flag 12. This opening has been incorporated into the flag 12 to increase the plastic/die interface and improve adhesion and reduce the so called "popcorning" effect. As is known in the art, popcorning is a problem associated with plastic encapsulated semiconductor devices, in which devices moisture is trapped by the plastic encapsulant. Upon subsequent heating during processing steps (e.g., solder reflow) the package has the tendency to delaminate internally and have an associated "popping" sound. It is noted that the leadframe depicted in FIG. 1 is designed for a two-sided package, wherein exposed lead portions 22 protrude along only two opposing sides of the finished packaged semiconductor device. As such, the leadframe is generally used in connection with relatively low lead count devices.

FIG. 2 depicts another leadframe design, generally known in the art as an "X-flag" leadframe. The same reference numerals are used in FIG. 2 to depict the same components of the leadframe shown in FIG. 1. The tie bars 20 extend from each of the corners of the leadframe, in contrast to the leadframe shown in FIG. 1. Accordingly, the tie bars are not oriented parallel or perpendicular to either axis of the leadframe (they are 45 degrees with respect to each of the axes). This configuration of the tie bars enables the provision of leads at each of the four sides of the leadframe, and hence to each of the four sides of the final, packaged semiconductor device. As shown, the flag 12 of FIG. 2 takes the form of a "mini-flag" to improve the plastic/die interfacial area and address the popcorning problem noted above. The prior art leadframe shown in FIG. 2 provides an important advantage over that shown in FIG. 1. Particularly, the X-flag leadframe permits use of various die sizes by combining use of the mini-flag and the four tie bars extending along the corners of the package.

The present inventors have recognized a need in the art for providing an improved leadframe design for two-sided packages, particularly, one that permits use of a relatively wide range of die sizes while preventing the popcorning problem. In this regard, turning back to the leadframe shown in FIG. 1, the range of die sizes that can be used is quite limited. Particularly, the die cannot be sized such that it is not adequately supported by the flag (in view of the window or opening formed therein). In addition the die has to be large enough to minimize the amount of exposed flag area, to prevent unwanted shorting between the flag 12 and the bond wires electrically connecting the die 50 to the lead tips 16. On the other hand, the die cannot be sized so as to overlap or otherwise intersect the lead tips 16, so that the bond wires may be connected to the leads 14.

BRIEF DESCRIPTION OF THE DRAWINGS

FIG. 5 is an exploded plan view of the flag of a leadframe according to one embodiment of the present invention;

FIG. 6 is an exploded plan view of the flag of a leadframe according to another embodiment of the present invention; and FIG. 7 is a cross-sectional view of an embodiment of the present invention, taken along the midline.

Figure 1:
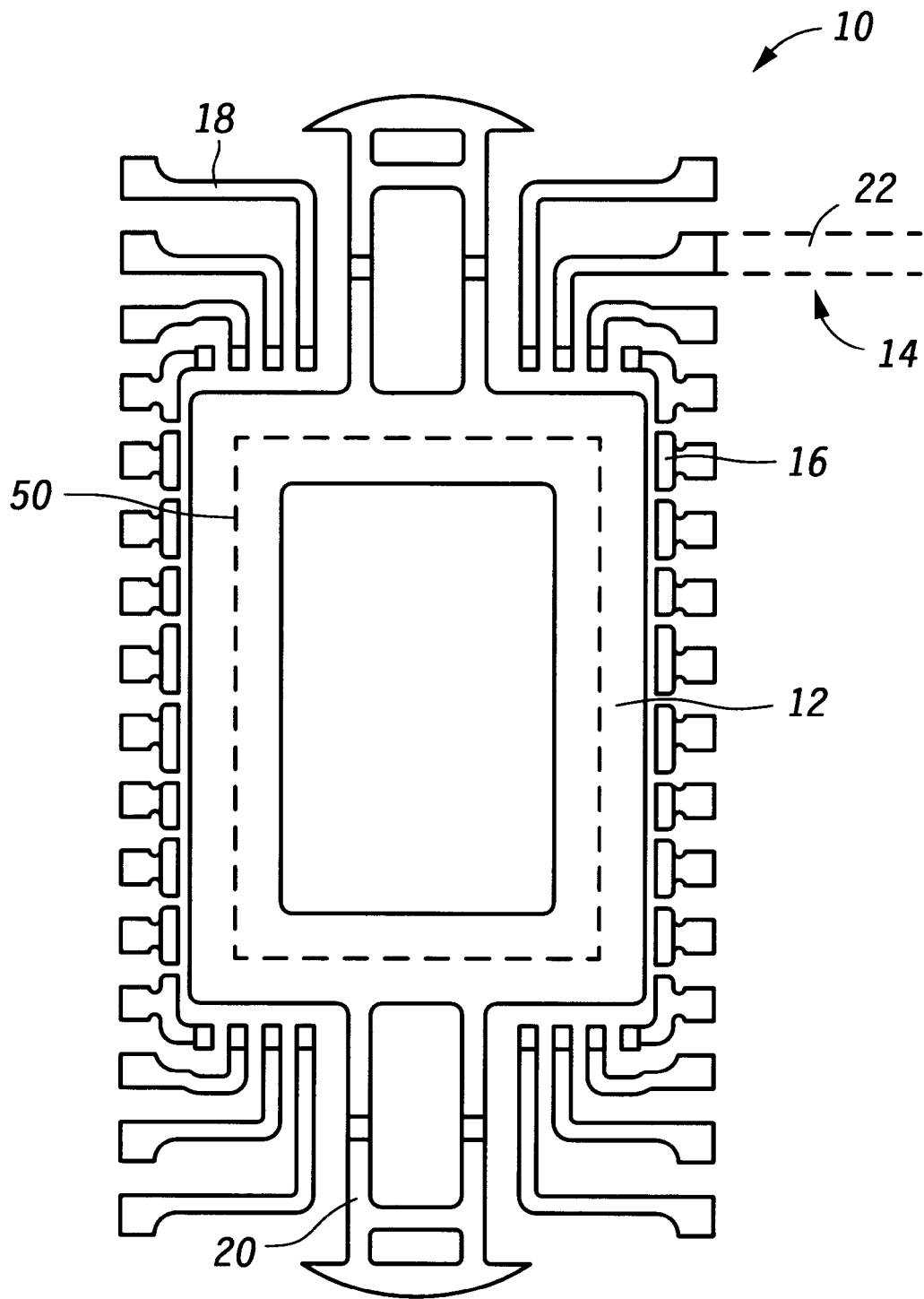
FIG. 1 depicts a conventional leadframe having a "window-flag"
Figure 2:
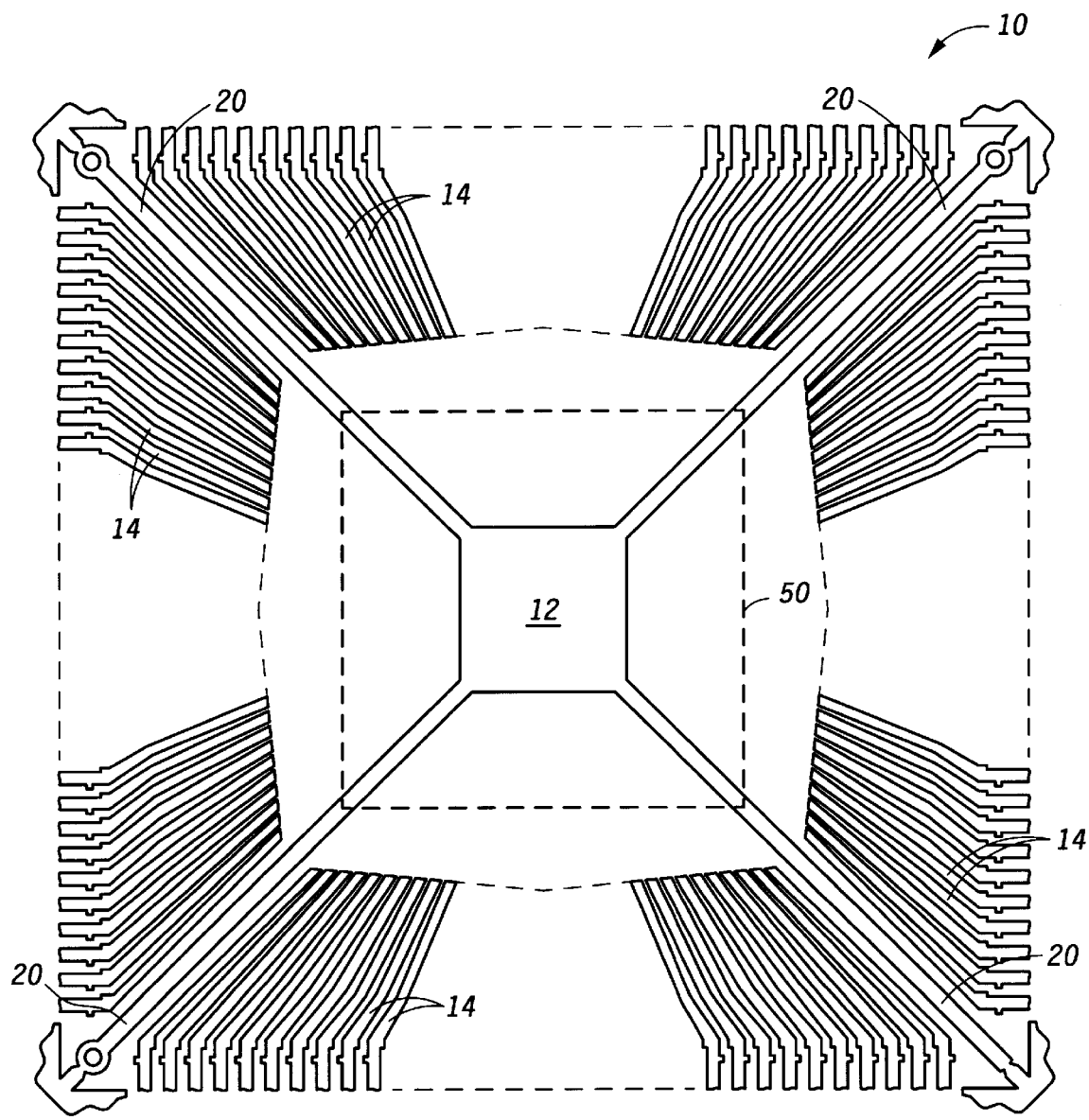
FIG. 2 depicts a conventional leadframe having an "X-flag"

It will be appreciated that for simplicity and clarity of illustration, elements illustrated in the figures have not necessarily been drawn to scale. For example, the dimensions of some of the elements are exaggerated relative to other elements for clarity. Further, where considered appropriate, reference numerals have been repeated among the figures to indicate corresponding or analogous elements.

DETAILED DESCRIPTION OF THE DRAWINGS

Figure 3:
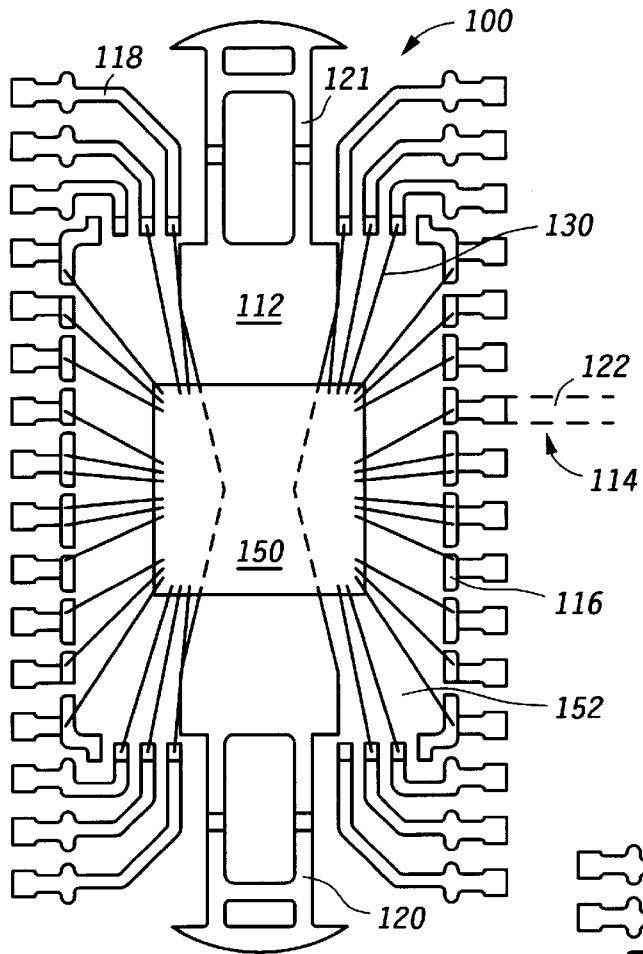
FIGS. 3 and 4 depict embodiments of the present invention showing differently sized die on the same leadframe.

Turning to FIG. 3, a leadframe according to an embodiment of the present invention is depicted. Leadframe 100 is made by conventional techniques (e.g., etching or preferably stamping) from a sheet of any one of conventional alloys, such as copper alloys. Leadframe 100 includes a flag 112 having a particular configuration (described in more detail below) that supports semiconductor die 150. The leadframe 100 further includes a plurality of leads 114 including bond fingers 118 each having a lead tip 116. In the final, packaged semiconductor device, the bond fingers 118 including lead tips 116 are encapsulated by plastic material. The leads further include exposed lead portions 122 (only one of which is shown in phantom lines) that may be configured in various forms. Exposed lead portions 122 protrude beyond the plastic encapsulating body (not shown in FIG. 3). The leadframe further includes two first tie bars 120 and two second tie bars 121, provided at opposite longitudinal ends of the leadframe. The tie bars 120, 121 serve to support the flag 112 prior to singulation, die mounting and subsequent encapsulation. As is known in the art, bond wires 130 are provided to interconnect bond pads provided on the top, active surface of the semiconductor die, to respective lead tips 116 (which define the inner lead portions of the leads 114). As is shown by a comparison between FIGS. 3 and 4, the leadframe may accommodate quite varying sizes in the semiconductor die, while providing sufficient die/plastic interfacial area to prevent popcorning.

As noted above, the lead tips 116 which form inner lead portions together define and bound an open area, or die receiving area. As shown, this die receiving area 152 is rectangular, having first and second sides that are opposite one another and third and fourth sides opposite each other. As shown, the first and second sides are shorter than the third and fourth sides. As shown, the first tie bars 120 and the second tie bars 121 are perpendicular to the first and second sides of the die receiving area 152.

FIG. 5 illustrates a more detailed view of a flag according to an embodiment of the present invention. The flag 112 has a first end 160 and a second end 162, and a longitudinal axis 210. As shown, midline 200 extends perpendicular to the longitudinal axis, and through a geometrical midpoint of the flag 112. The first end 160 has an associated width, W1 and the second end 162 has an associated width, W2. As is shown, the flag continuously reduces in width from first inflection point 202 adjacent the first end 160, to the midline 200. Similarly, the flag continuously reduces in width from second inflection point 203 adjacent second end 162, to midline 200. It is emphasized that the two halves of the flag reduce in width to a common point, midline 200. Although preferable, the midline 200 need not pass through the geometric center point (i.e., bisects the flag), as long as the midline passes through the minimum width W3 of the flag 112. In the particular embodiment shown in FIG. 5, the distances L1 and L2 (i.e., the lengths of a first constant width portion and the length of a second constant width portion), from respective ends of the flag to respective inflection points, are kept relatively short. In this regard, the flag has a full length L, and a ratio L/L1, and a ratio L/L2 are greater than 4, more preferably, greater than 8. In one particular embodiment, L1 and L2 are each equal to 60 mils (1.542 mm) while L is equal to 470 mils (11.938 mm). This configuration provides L/L1 and L/L2 ratios of 7.83. In this particular embodiment, W3 is equal to 45 mils (1.143 mm) while W1 and W2 equal 108 mils (2.743 mm).

Turning to FIG. 6, an alternative embodiment is shown in which the constant width portions shown in FIG. 5 are eliminated, and the flag tapers in its entirety from the first end to the midline, and from the second end to the midline. Alternatively stated, the flag 112 in the embodiment shown in FIG. 6 has no constant width portions.

FIG. 7 depicts a cross-sectional view of an embodiment of the present invention, taken along midline 200. As can be seen, the flag 112 supports semiconductor die 150, via die attach epoxy 140. The bond wires 130 connect the semiconductor die 150 to the leads 114, particularly, the lead tips 116 of bond fingers 118. Although not shown in the cross-sectional view of FIG. 7, the packaged semiconductor device 300 includes first and second sides that are opposite each other, and which parallel the first and second sides of the leadframe. The third and fourth sides 204 and 206, respectively, are shown in FIG. 7. According to this particular embodiment, the exposed lead portions 122 are provided only along the third and fourth sides 204 and 206, respectively. Further, plastic encapsulant material 142 (forming a plastic encapsulant body) is provided to enclose and encapsulate the flag 112, semiconductor die 150, bond wires 130, and bond fingers 118, thereby leaving exposed lead portions 122 protruding from the plastic encapsulant material 142. While the exposed lead portions 122 are in the form of J-leads, they may be embodied alternatively as gull-wing leads, or others as are known in the art.

Although the leadframes illustrated herein have solid, continuous flags, openings may be provided in the flag, which are filled with plastic encapsulant. The openings provide the advantage of increasing the plastic/die interfacial area, thus further preventing delamination.

Figure 4:
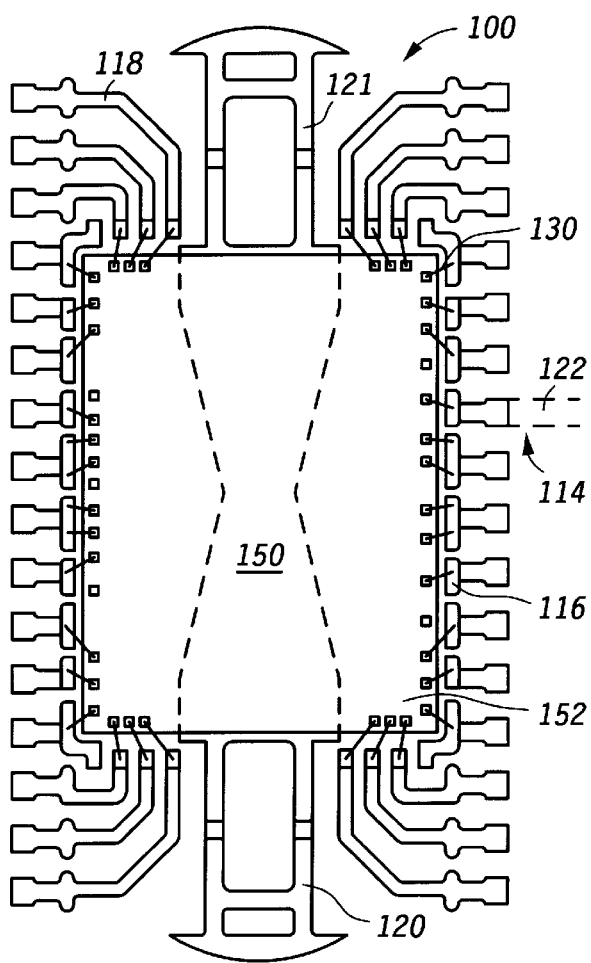

According to the present invention, a leadframe and semiconductor device are provided, including a flag having a general hourglass shape, in which the flag continuously tapers from first and second ends of the flag, to a common midline. According to the present invention, various die sizes may easily be accommodated, as shown in FIGS. 3 and 4. In addition, other advantages are realized due to the wide applicability of the present leadframe. For example, semiconductor devices may be packaged with reduced cycle time, since a specific leadframe need not be designed for every particular configuration of semiconductor die. Accordingly, the lag time associated with having different leadframes fabricated may be eliminated. Further, due to the wide applicability of the present leadframe, the leadframe may be made by stamping techniques, rather than etching, in view of the relatively high number of leadframes to be produced. That is, because of the wide applicability, a relative large number of leadframes may be made in a single production run, whereby stamping becomes cost effective as compared to etching. In addition, by providing the continuously tapering contour according to the present invention, unwanted material of the flag may be eliminated, thereby increasing the plastic/die interface, and attenuating the popcorning problem associated with certain prior art leadframes.

While embodiments of the present invention have been described above with particularity, it is understood that various modifications may be made to the present invention without departing from the spirit and scope of the claims appended hereto.

What is claimed is:

1. A leadframe for a semiconductor device, comprising:
a plurality of leads having inner lead portions that terminate to define a die receiving area, the die receiving area having first and second sides that are opposite each other, and third and fourth sides that are opposite each other; and
at least one first tie bar and at least one second tie bar supporting a flag in the die receiving area, the at least one first tie bar and the at least one second tie bar extending generally perpendicular to the first and second sides, respectively; wherein
(i) the flag has a longitudinal axis that is parallel to first and second tie bars, and a midline extending perpendicular to the longitudinal axis, the flag having a minimum width W3 along the midline and a length L, (ii) the flag continuously reduces in width from a point adjacent a first end of flag having a width W1 to the midline, and from a point adjacent a second end of the flag having a width W2 to the midline, and (iii) the flag continuously reduces in width from the first end of the flag to the midline, and from the second end of the flag to the midline.

2. A leadframe for a semiconductor device, comprising:
a plurality of leads having inner lead portions that terminate to define a die receiving area, the die receiving area having first and second sides that are opposite each other, and third and fourth sides that are opposite each other; and
at least one first tie bar and at least one second tie bar supporting a flag in the die receiving area, the at least one first tie bar and the at least one second tie bar extending generally perpendicular to the first and second sides, respectively; wherein
(i) the flag has a longitudinal axis that is parallel to first and second tie bars, and a midline extending perpendicular to the longitudinal axis, the flag having a minimum width W3 along the midline and a length L, (ii) the flag continuously reduces in width from a point adjacent a first end of flag having a width W1 to the midline, and from a point adjacent a second end of the flag having a width W2 to the midline, and (iii) the flag has a first constant width portion having a length L1 extending between the first end and a first inflection point, and a second constant width portion having a length L2 extending between the second end and a second inflection point, and wherein a ratio L/L1 and a ratio L/L2 are greater than 4.

3. The leadframe of claim 2, wherein the ratio L/L1 and the ratio L/L2 are greater than 8.

4. A leadframe for a semiconductor device, comprising:

a plurality of leads having inner lead portions that terminate to define a die receiving area, the die receiving area having first and second sides that are opposite each other, and third and fourth sides that are opposite each other; and at least one first tie bar and at least one second tie bar supporting a flag in the die receiving area, the at least one first tie bar and the at least one second tie bar extending generally perpendicular to the first and second sides, respectively; wherein
  (i) the flag has a longitudinal axis that is parallel to first and second tie bars, and a midline extending perpendicular to the longitudinal axis, the flag having a minimum width W3 along the midline and a length L (ii) the flag continuously reduces in width from a point adjacent a first end of flag having a width W1 to the midline, and from a point adjacent a second end of the flag having a width W2 to the midline, and (iii) the at least one first tie bar comprises two first tie bars, and the at least one second tie bar comprises two second tie bars.

5. The leadframe of claim 1, wherein the first and second sides are shorter than the third and fourth sides.

6. The leadframe of claim 1, wherein the midline bisects the flag along the length L.

7. The leadframe of claim 1, wherein each lead includes a bonding finger and an exposed lead portion.

8. The leadframe of claim 7, wherein the bonding finger has a lead tip.

9. A semiconductor device, comprising:

leadframe including (a) a plurality of leads having inner lead portions that terminate to define a die receiving area, the die receiving area having first and second sides that are opposite each other, and third and fourth sides that are opposite each other; and (b) at least one first tie bar and at least one second tie bar supporting a flag in the die receiving area, the at least one first tie bar and the at least one second tie bar extending generally perpendicular to the first and second sides, respectively; wherein (i) the flag has a longitudinal axis that is parallel to first and second tie bars, and a midline extending perpendicular to the longitudinal axis, the flag having a minimum width W3 along the midline and a length L, and (ii) the flag continuously reduces in width from a point adjacent a first end of flag having a width W1 to the midline, and from a point adjacent a second end of the flag having a width W2 to the midline;

a semiconductor die overlying the flag;

a plurality of bond wires electrically connecting the semiconductor die to the plurality of leads; and a plastic encapsulant body enclosing the semiconductor die, the flag and portions of the plurality of leads, wherein the flag continuously reduces in width from the first end of the flag to the midline, and from the second end of the flag to the midline.

10. semiconductor device, comprising:

leadframe including (a) a plurality of leads having inner lead portions that terminate to define a die receiving area, the die receiving area having first and second sides that are opposite each other, and third and fourth sides that are opposite each other; and (b) at least one first tie bar and at least one second tie bar supporting a flag in the die receiving area, the at least one first tie bar and the at least one second tie bar extending generally perpendicular to the first and second sides, respectively; wherein (i) the flag has a longitudinal axis that is parallel to first and second tie bars, and a midline extending perpendicular to the longitudinal axis, the flag having a minimum width W3 along the midline and a length L, and (ii) the flag continuously reduces in width from a point adjacent a first end of flag having a width W1 to the midline, and from a point adjacent a second end of the flag having a width W2 to the midline;

a semiconductor die overlying the flag;

a plurality of bond wires electrically connecting the semiconductor die to the plurality of leads; and a plastic encapsulant body enclosing the semiconductor die, the flag and portions of the plurality of leads, wherein the flag has a first constant width portion having a length L1 extending between the first end and a first inflection point, and a second constant width portion having a length L2 extending between the second end and a second inflection point, and wherein a ratio L/L1 and a ratio L/L2 are greater than 4.

11. The semiconductor device of claim 10, wherein the ratio L/L1 and the ratio L/L2 are greater than 8.

12. A semiconductor device, comprising:

leadframe including (a) a plurality of leads having inner lead portions that terminate to define a die receiving area, the die receiving area having first and second sides that are opposite each other, and third and fourth sides that are opposite each other; and (b) at least one first tie bar and at least one second tie bar supporting a flag in the die receiving area, the at least one first tie bar and the at least one second tie bar extending generally perpendicular to the first and second sides, respectively; wherein (i) the flag has a longitudinal axis that is parallel to first and second tie bars, and a midline extending perpendicular to the longitudinal axis, the flag having a minimum width W3 along the midline and a length L, and (ii) the flag continuously reduces in width from a point adjacent a first end of flag having a width W1 to the midline, and from a point adjacent a second end of the flag having a width W2 to the midline;

a semiconductor die overlying the flag;

a plurality of bond wires electrically connecting the semiconductor die to the plurality of leads; and a plastic encapsulant body enclosing the semiconductor die, the flag and portions of the plurality of leads, wherein the at least one first tie bar comprises two first tie bars, and the at least one second tie bar comprises two second tie bars.

13. The semiconductor device of claim 12, wherein the first and second sides are shorter than the third and fourth sides.

14. The semiconductor device of claim 12, wherein the midline bisects the flag along the length L.

15. The semiconductor device of claim 12, wherein the plastic encapsulant body has first and second sides that are opposite each other and which are generally parallel to the first and second sides of the die receiving area, and third and fourth sides that are opposite each other and which are generally parallel to the third and fourth sides of the die receiving area, the plurality of leads having exposed lead portions that protrude from the plastic encapsulant body, the exposed lead portions being present only along the third and fourth sides of the plastic encapsulant body.

16. The semiconductor device of claim 12, wherein the first and second sides of the plastic encapsulant body are shorter than the third and fourth sides of the plastic encapsulant body.

17. The semiconductor device of claim 12, wherein the plurality of leads have exposed lead portions that protrude from the plastic encapsulant body, the exposed lead portions comprising J-leads.

* * * * *